219-121

Nov. 25, 1969 J. BEESLEY ET AL 3,480,755
METHOD OF ATTACHING INTEGRATED CIRCUITS TO A SUBSTRATE BY
AN ELECTRON BEAM
Filed March 16, 1967

APPLICANTS
John Beesley and
Robert Anthony Hyman
BY
Misegades & Douglas
ATTORNEYS United States Patent Office 3,480,755

Patented Nov. 25, 1969

3,480,755

METHOD OF ATTACHING INTEGRATED CIRCUITS TO A SUBSTRATE BY AN ELECTRON BEAM

John Beesley and Robert Anthony Hyman, London, England, assignors to English Electric-Leo-Marconi Computers Limited, London, England, a British company Filed Mar. 16, 1967, Ser. No. 623,604

Claims priority, application Great Britain, Mar. 16, 1966, 11,624/66

Int. Cl. B23k *15/00*

U.S. Cl. 219—121 4 Claims

ABSTRACT OF THE DISCLOSURE

In the utilization of integrated circuits, the connection of inputs and outputs of the circuit chip presents serious problems. For example, one known method involves connecting fine wires between areas on the chip and a set of relatively large terminals provided on a substrate. The present invention provides a method of attaching an integrated circuit chip to a plurality of conducting lands on a substrate, in which an electron beam of appropriate energy is directed on to the chip in at least the regions overlying the lands, the lands being formed of material of lower melting point than the chip and the beam passing through the chip without melting it and into the lands and melting them in the vicinity of the chip, thus welding the chip to the lands. The method is well suited for use in automatic processes.

The present invention relates to a method of attaching an integrated circuit chip to a plurality of conducting lands on a substrate.

According to the invention, in such a method an electron beam of appropriate energy is directed on to the chip at least in the regions overlying the lands, the lands being formed of material of lower melting point than the chip and the beam passing through the chip without melting it and into the lands and melting them in the vicinity of the chip, thus welding the chip to the lands.

Several methods of welding integrated circuit chips to conducting lands on substrates will now be described by way of example with reference to the accompanying drawings in which.

Figure 1:
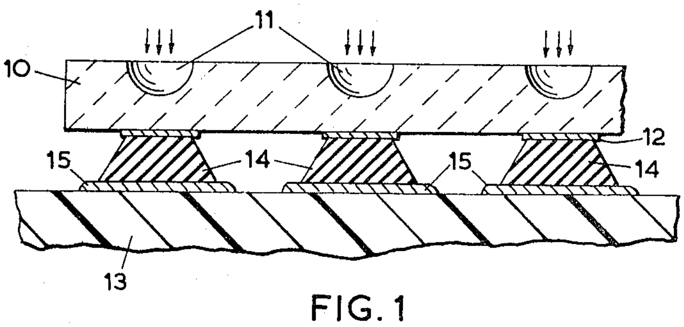
FIG. 1 is a sectional view of part of a chip and a substrate in position for welding.
Figure 2:
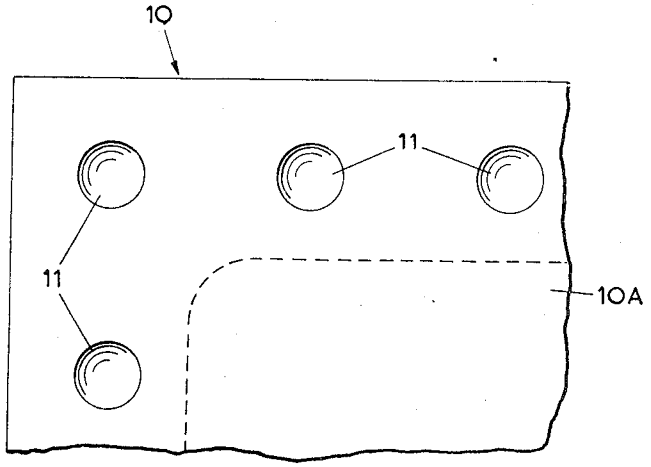
FIG. 2 is a plan view of part of the chip.

Referring to the drawing, in FIGURES 1 and 2 an integrated circuit silicon chip 10 which is approximately 100 microns thick has recesses 11 which are approximately 50 microns deep formed in its upper surface. Connector pads 12 which are approximately 2.5 microns thick are formed on the lower surface of the chip below the recesses 11. The pads 12 are electrically connected to the circuit components in the chip and provide input and output circuit paths for these circuit components.

The chip 10 is held above a ceramic substrate 13 having metallic lands 14, about 50 microns high, secured to its upper surface so that the lands 14 and pads 12 are pressed together as shown. The lands 14 are formed on tracks 15 which run across the surface of the substrate and form connections between these lands and other lands connected to other chips on the same substrate. The tracks also provide connections for input and output circuits.

To secure the chip to the substrate, an electron beam is directed onto the chip for a predetermined time interval, the beam passing through the chip and fusing the upper parts of the underlying lands 14, thereby forming welded joints between the respective pads and lands 14 as the lands solidify again. The welding operation is carried out in a vacuum or an inert atmosphere.

Figure 3:
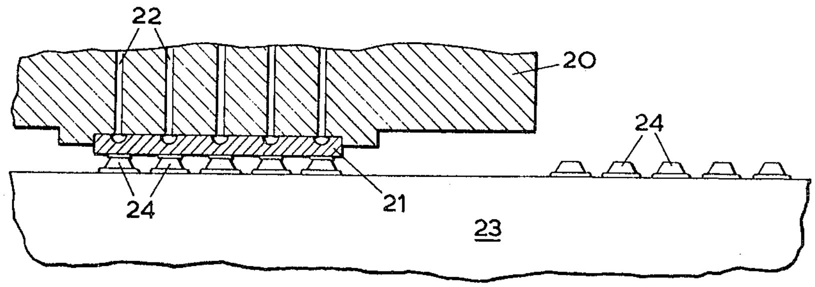
FIG. 3 is a part sectional view of part of a welding machine for carrying out the welding.

The present welding technique is particularly suitable for automatic or semi-automatic processes, and part of such a process will now be described with reference to FIG. 3. A jig 20 which holds a chip 21 is arranged having a plurality of channels 22 above the chip for allowing an electron beam to pass through the recessed portions of the chip 21. A substrate 23 having a plurality of lands 24 formed thereon is supported by a work-table (not shown) and controlled to move into a specific predetermined position under the holder 20. The control system for positioning the substrate 23 is similar to that commonly used in an X/Y plotter.

Once the substrate is in position, the jig 20 is lowered to press the pads on the chip 21 against the respective lands on the substrate 23, and the chip is then welded to the lands as described above with reference to FIGS. 1 and 2.

Once the welding operation in completed, the jig 20 is arranged to release the chip and allow the chip to move away with the substrate. Another chip is then placed in the jig and the substrate moved into a new predetermined position for welding another chip to the substrate in the same manner. It will be appreciated that the jig may be adapted to hold more than one chip at a time to enable several chips to be welded to the substrate in a single welding operation.

The process is carried out in a vacuum or inert atmosphere but it will be appreciated that the electron gun which generates the electron beam need not itself be contained in the vacuum or the inert atmosphere. Instead, the electron gun may be arranged to project the electron beam through ports or transparent windows into the evacuated or inert area.

The simplest method of welding is to use a broad or defocussed electron beam whose energy content is substantially uniform over the whole of the area of the chip. A suitable accelerating potential for the beam is 150 kv. This arrangement, however, is liable to cause damage to the chip, so that a better method is to use a defocussed beam and to place a mask above the chip during welding, the mask having holes formed in it corresponding to the lands and protecting the remaining parts of the chip (i.e. those parts not lying above the lands) from damage.

The difficulty with using a defocussed beam is that the total energy of the beam must be extremely high in order to obtain a sufficient energy at each of the lands to effect welding. This difficulty can be overcome by using a focussed beam which is scanned or deflected on to each land in turn. With such a beam, a beam current of 2.5 ma. is suitable. The simplest method using such a beam involves scanning the beam over all lands in a single cycle, the cycle time being short enough for all lands to have their upper portions molten simultaneously. This will ensure that all lands touch the chip and reduce any strains produced on cooling and solidification of the lands. For this, a cycle time of less than 10 microseconds is desirable, and a beam movement of about 0.5 cm. during this time will be required. This movement may be continuous, or alternatively it may be discontinuous with the beam dwelling on each of the lands in turn if the beam deflection system is capable of producing the necessary rapid changes of beam deflection. A modification of this method involves the use of a plurality of scanning cycles, the beam falling on each land in turn during each of the cycles. This will enable higher temperatures to be achieved while still having all lands molten simultaneously.

A further method also uses a focussed and scanned beam, and can be used for chips having the lands evenly arranged around their periphery. In this method, the lands are divided into opposite pairs, and a separate scanning cycle is used for each such pair of lands, so that if there are, for example fourteen lands then a total of seven cycles will be required for completing the welding. This method will of course be somewhat slower than the previous methods.

In all the methods using a scanned and focussed beam, the beam may of course be turned off while it is being moved and only turned on when it is directed on to the lands. A mask may also be used with any of the scanned beam methods to protect the chips from damage.

The chip is made of silicon, and should have a thickness not exceeding 50 microns in the regions in which it is to be welded to the underlying lands. Thus if a thickness greater than this is required by the particular methods by which the integrated circuit is formed, the chip must be provided with recesses 11 as shown in FIGS. 1 and 2. The active regions of the chip, i.e. the regions which are utilised for the circuit functions, should be kept away from the contacts; thus the region 10A in FIG. 2 will contain the active regions of chip 10. The effect of the electron beam on the chip is three-fold. Firstly, surface damage to the chip may occur on its upper surface. For this reason, the active regions of the chip are formed on the lower surface as seen in FIG. 1. Secondly, body damage may occur as the electron beam passes through the chip. This damage will be confined mainly to the topmost 10 or 15 microns of the thickness of the chip, and since the active regions can be formed in a thickness of not more than 25 microns on the opposite side of the chip, this body damage should also have little deleterious effect on the electrical characteristics of the chip. Thirdly, the electron beam will cause a rise in temperature of the chip, and this may result in some diffusion of the impurities which form the active regions of the chip. By utilising a focussed beam and/or a mask, however, the temperature rise can be kept small and confined to regions of the chip relatively remote from the active areas. Also, by annealing the chip after welding, radiation damage can be substantially reduced. Radiation damage can also be minimised by providing a protective coating of suitable material such as gold on the upper surface of the chip opposite the active areas, such as area 10A in FIG. 2.

The material of the lands should have a high density relative to that of the chip, so that the electron beam passing through the chip is effectively absorbed by the upper parts of the lands. The lower practical limit is a specific gravity of about 6 or 7. The material of the lands should also have a low melting point relative to that of the chip, and a low thermal conductivity is also desirable so that the energy absorbed in the upper parts of the lands is not dissipated too rapidly by conduction down to the substrate. However, the thermal conductivity should not be too low, as conduction of heat from the chip through the lands into the substrate plays a significant role in dissipating heat from the chip when it is operating in a completed circuit.

One material suitable for use for the lands is a gold-germanium eutectic containing approximately 27% germanium. In the solid state, this material has two phases, and the rate at which it melts is therefore dependent on the grain size of the gold phase. Thus a suitable welding method for use with this material is the method involving a plurality of scans of the electron beam, the grain size reducing with each scan until complete melting of the material is achieved.

The height of the lands must be controlled sufficiently accurately to ensure that all lands contact the chip during welding. During welding, the lands will expand as they are heated, and a suitable tolerance on the land height is 0.1 micron for a total land height of 50 microns.

We claim:

1. The method of fabricating a unitary structure of an integrated circuit chip bonded to a substrate, which method comprises the steps of, preparing a semiconductor chip with active circuit elements formed therein and with conductive pads on one face thereof conductively connected to the active circuit elements;

forming a plurality of depressions in the other face of the chip, each depression being opposite one of said pads;

preparing a jig to accommodate the chip and forming apertures through the jig in positions to align with said pads;

positioning the chip in the jig;

preparing a non-conductive substrate with conductive lands corresponding in position to said pads;

aligning the jig and the substrate to bring the pads on the chip into contact with the corresponding lands on the substrate; and directing an electron beam at the jig to cause electrons to pass through the apertures therein and through the portions of the chip beneath said depressions and to impinge upon said pads to effect welding of said pads to said lands.

2. The method as claimed in claim 1, in which the step of directing the electron beam at the jig includes the steps of, focussing said beam to enable the beam to pass through any one of said apertures; and scanning said beam from aperture to aperture at a rate which is sufficient to ensure that all the lands are molten simultaneously.

3. The method as claimed in claim 1, in which the pads are symmetrically arranged, and in which the step of directing the electron beam includes the steps of, focussing said beam to enable the beam to pass through any one of said apertures, and scanning said beam between an opposite pair of said apertures to effect welding of the corresponding pads and repeating the scanning for other pairs of said apertures in turn until all the pads have been welded.

4. The method as claimed in claim 1, including the further step of annealing the chip after welding.

References Cited

UNITED STATES PATENTS

| | | | |
|---|---|---|---|
| 2,267,752 | 12/1941 | Ruska et al. | |
| 3,178,804 | 4/1965 | Ullery et al. | |
| 3,368,116 | 2/1968 | Spaude. | |
| 3,391,451 | 7/1968 | Moore ----------- | 29—626 X |

JOSEPH V. TRUHE, Primary Examiner

W. DEXTER BROOKS, Assistant Examiner